(12) United States Patent
Xu et al.

(10) Patent No.: US 7,294,528 B2
(45) Date of Patent: Nov. 13, 2007

(54) SUPERCRITICAL FLUID-ASSISTED DEPOSITION OF MATERIALS ON SEMICONDUCTOR SUBSTRATES

(75) Inventors: Chongying Xu, New Milford, CT (US); Thomas H. Baum, New Fairfield, CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 196 days.

(21) Appl. No.: 11/078,211

(22) Filed: Mar. 11, 2005

(65) Prior Publication Data

US 2005/0181613 A1 Aug. 18, 2005

Related U.S. Application Data

(62) Division of application No. 10/303,479, filed on Nov. 25, 2002, now Pat. No. 7,030,168.

(60) Provisional application No. 60/345,738, filed on Dec. 31, 2001.

(51) Int. Cl.
*H01L 51/40* (2006.01)
(52) U.S. Cl. .......................... 438/99; 438/787
(58) Field of Classification Search ................ 438/99, 438/767, 771, 784
See application file for complete search history.

(56) References Cited

U.S. PATENT DOCUMENTS

| | | | |
|---|---|---|---|
| 4,970,093 A | 11/1990 | Sievers | |
| 5,211,342 A | 5/1993 | Hoy et al. | |
| 5,225,561 A | 7/1993 | Kirlin et al. | |
| 5,453,494 A | 9/1995 | Kirlin et al. | |
| 5,789,027 A * | 8/1998 | Watkins et al. | 427/250 |
| 5,820,664 A | 10/1998 | Gardiner et al. | |
| 5,840,897 A | 11/1998 | Kirlin et al. | |
| 5,952,040 A | 9/1999 | Yadav et al. | |
| 6,110,529 A | 8/2000 | Gardiner et al. | |
| 6,194,650 B1 | 2/2001 | Wakayama | |
| 6,207,522 B1 | 3/2001 | Hunt et al. | |
| 6,245,150 B1 | 6/2001 | Lyons | |
| 6,284,655 B1 | 9/2001 | Marsh | |
| 6,403,663 B1 * | 6/2002 | DeSimone et al. | 521/97 |
| 6,576,345 B1 | 6/2003 | Van Cleemput et al. | |
| 6,592,938 B1 | 7/2003 | Pessey | |
| 6,652,920 B2 | 11/2003 | Carbonell | |
| 6,653,236 B2 * | 11/2003 | Wai et al. | 438/687 |
| 6,818,301 B2 | 11/2004 | Obeng | |
| 2003/0134049 A1 | 7/2003 | Carbonell et al. | |
| 2004/0023453 A1 | 2/2004 | Xu et al. | |

FOREIGN PATENT DOCUMENTS

WO  03058680  7/2003

OTHER PUBLICATIONS

Brian N. Hansen, et al., "Supercritical Fluid Transport-Chemical Deposition of Films" Chemical Materials, 1992, 4, 749-752.
Jason M. Blackburn, et al., "Deposition of Conformal Copper and Nickel Films from Supercritical Carbon Dioxide" Science, vol. 294, Oct. 5, 2001, pp. 141-145.
C.Y. Xu, et al., "Supercritical Carbon Dioxide Assisted Aerosolization for Thin Film Deposition, Fine Powder Generation, and drug delivery", Green Chemistry, Editors: Anastas, Paul T., et al. Oxford University Press, Oxford, UK, pp. 312-335.

* cited by examiner

*Primary Examiner*—Phuc T. Dang
(74) *Attorney, Agent, or Firm*—Maggie Chappuis; Tristan A. Fuierer; Moore & Van Allen PLLC

(57) ABSTRACT

Supercritical fluid-assisted deposition of materials on substrates, such as semiconductor substrates for integrated circuit device manufacture. The deposition is effected using a supercritical fluid-based composition containing the precursor(s) of the material to be deposited on the substrate surface. Such approach permits use of precursors that otherwise would be wholly unsuitable for deposition applications, as lacking requisite volatility and transport characteristics for vapor phase deposition processes.

91 Claims, No Drawings

SUPERCRITICAL FLUID-ASSISTED DEPOSITION OF MATERIALS ON SEMICONDUCTOR SUBSTRATES

CROSS-REFERENCE TO RELATED APPLICATION

This is a division of U.S. application Ser. No. 10/303,479, filed on Nov. 25, 2002, now U.S. Pat. No. 7,030,168 now allowed.

The priority of U.S. provisional patent application No. 60/345,738 filed Dec. 31, 2001 is hereby claimed.

FIELD OF THE INVENTION

The present invention relates generally to using supercritical fluids to effect the deposition of materials on substrates, e.g., semiconductor substrates, in the manufacture of semiconductor devices and device precursor structures.

DESCRIPTION OF THE RELATED ART

In the field of semiconductor manufacturing, deposition of materials on semiconductor substrates is carried out by a variety of techniques, including chemical vapor deposition (CVD), physical vapor deposition (PVD) and electroplating (for metallization and interconnect formation).

Conventional CVD processes require volatile precursors for the formation of precursor vapors that are transported to the chemical vapor deposition chamber. However, many chemical species are neither thermally stable enough, nor volatile enough, for sustained vaporization, delivery and deposition. As a consequence, CVD processes for film deposition are largely limited by the availability of volatile and stable precursors as source reagents.

PVD, utilizing a charged gas and a sputter target to effect deposition of material on a substrate, is well-developed and widely used in the art, but is limited by the significant particle levels that are generated in the process, as well as by constraints on controllability and conformality of the deposition process when tight geometries and small features are involved, and by process control issues relating to diffusion of the sputtered material. Due to the ballistic nature of sputtered materials, it is extremely difficult to achieve conformal coverage on complex topography of next generation patterned substrates.

Currently, many integrated circuit (IC) processes require low cost deposition of conformal thin-films for interconnect and dielectric structures. The ability to deposit thin films, e.g., having a thickness below about 1 µm, depends on the gas-phase transport of volatile organometallic precursors that decompose at elevated temperatures onto patterned substrates. Although many of such processes are extremely well-developed for advanced microelectronic device manufacture, the application of these processes for high aspect ratio via filling is burdened by difficulties.

For deposition of conducting materials such as copper, CVD processes therefore can only compete with electroplating techniques (aqueous based processes) when the cost of ownership (COO) for the process is small. At dimensions of <0.1 micron, copper-porous low k multi-layers may require special, non-aqueous processing to avoid aqueous contamination of the low k pore structures and decreased device yields, and to enhance device reliability. Further, the dielectric constant of the low k material is critical and aqueous contamination can negatively increase dielectric constants, which is largely unacceptable. Further, electroplating requires a conformal, conductive and uniform seed layer to enable the technique. The seed layer is deposited by PVD in conventional practice. With decreasing feature size and increasing aspect ratio, the use of PVD to obtain the required seed layers becomes a major technical challenge. Although ionized PVD conceivably could be useful for such purpose, alternative techniques are required, which are compatible with low k dielectrics.

The foregoing constraints and deficiencies of conventional semiconductor manufacturing deposition techniques reflect the need of the art for improved process technologies that are free of such limitations.

SUMMARY OF THE INVENTION

The present invention relates to supercritical fluid (SCF)-assisted deposition of materials onto substrates.

In one aspect, the invention relates to a deposition composition for depositing material on a substrate, such deposition composition comprising a supercritical fluid and a precursor for the material to be deposited on the substrate.

Another aspect of the invention relates to a method of forming a material on a substrate, comprising depositing the material on the substrate from a deposition composition comprising a precursor of such material, and a supercritical fluid.

Other aspects, features and embodiments of the present invention will be more fully apparent from the ensuing disclosure and appended claims.

DETAILED DESCRIPTION OF THE INVENTION, AND PREFERRED EMBODIMENTS THEREOF

Supercritical fluids are formed under conditions at which the density of the liquid phase equals the density of the gaseous phase of the substance. For example, carbon dioxide ($CO_2$), which is a gas at standard temperature and pressure, undergoes a transition from liquid to SCF above a critical point, corresponding to $T_c \geq 31.1°$ C. and $p_c \geq 73.8$ atm. Once formed, the density of the SCF can be varied from liquid-like to gaseous-like, yielding different solvation abilities, by varying the pressure and temperature. Supercritical fluids have a solubility and diffusibility approaching that of the liquid and gaseous phase, respectively. Additionally, the surface tension of SCFs is negligible.

Because of its readily manufactured character, ability to be recycled, lack of toxicity and negligible environmental effects, supercritical $CO_2$ is a preferred SCF in the broad practice of the present invention, although the invention may be practiced with any suitable SCF species, with the choice of a particular SCF depending on the specific application involved.

The present invention relates to supercritical fluid-assisted deposition of thin-film (e.g., with a thickness of <1 µm) material on a substrate, e.g., a semiconductor wafer substrate.

Due to the progressively smaller dimensions of semiconductor patterns, the SCF-assisted deposition compositions of the present invention provide a distinct advantage in penetrating small geometry structures such as vias and trenches with high aspect ratios on a semiconductor wafer, as well as achieving improved homogeneity and extent of conformality of the deposited material, e.g., in films, layers and localized material deposits, particularly in instances in which the wettability of the substrate is low, as is the case with many semiconductor substrates.

The deposition compositions of the invention may be variously formulated for specific deposition applications, including suitable SCF(s) and source reagent (precursor) compound(s), complex(es) and material(s). Such compositions may further optionally comprise co-solvent(s), co-reactant(s), surfactant(s), diluent(s), and/or other deposition-facilitating or composition-stabilizing component(s), as necessary or desired for such applications.

In its simplest formulation, the deposition composition comprises at least one SCF and at least one precursor component. The composition thus comprises a supercritical fluid solution in which at least one precursor component is dissolved.

The SCF precursor solution in use can be delivered to a heated substrate for contacting therewith, to deposit on the substrate a material deriving from the precursor component(s). For example, the precursor component may comprise a source reagent compound or organometallic species or metal coordination complex for forming a metal or dielectric film on a semiconductor wafer substrate.

By the use of SCF-based deposition compositions, the precursor component(s) can be continuously delivered in a stream of the SCF-based deposition composition to the heated substrate, to deposit the desired material deriving from the precursor component(s) on the substrate surface. Concurrently, by-products of the deposition operation can be continuously carried out of the deposition chamber via continuous flow of the SCF-based composition through the deposition chamber containing the heated pedestal and substrate.

Alternatively, the deposition using the SCF-based deposition composition may be carried out in a batch mode, wherein the deposition composition is contacted with the substrate, and process condition(s) (e.g., temperature and/or pressure) of the composition are altered to effect the deposition of the desired material deriving from the composition.

Examples of SCF species useful in the broad practice of the invention include, but are not limited to, carbon dioxide, oxygen, argon, krypton, xenon, ammonia, methane, methanol, dimethyl ketone, hydrogen, forming gas, and sulfur hexafluoride.

Co-solvent or co-reactant species useful in the deposition compositions of the invention may be of any suitable type. Illustrative species include, but are not limited to, methanol, ethanol, and higher alcohols, N-alkylpyrrolidones or N-arylpyrrolidones, such as N-methyl-, N-octyl-, or N-phenyl-pyrrolidones, dimethylsulfoxide, sulfolan, catechol, ethyl lactate, acetone, butyl carbitol, monoethanolamine, butyrol lactone, diglycol amine, γ-butyrolactone, butylene carbonate, ethylene carbonate, and propylene carbonate.

Surfactants useful in the deposition compositions of the present invention may likewise be of any suitable type, including anionic, neutral, cationic, and zwitterionic types. Illustrative surfactant species include, without limitation, acetylenic alcohols and diols, long alkyl chain secondary and tertiary amines, and their respective fluorinated analogs.

The components of the SCF-based deposition compositions of the present invention may be present at any suitable concentrations and relative proportions, as appropriate to the use of the composition in depositing material on a substrate surface. For example, the precursor component(s) may be present at concentrations of from about 0.1% by weight to about 98% by weight, with suitable concentrations being dependent on the maximum solubility of the precursor in the supercritical fluid that is employed in the composition. For example, preferred concentration ranges of specific precursors may have any suitable minima (e.g., 0.2%, 0.5%, 1%, 5%, or 8%), and maxima (e.g., 10%, 12%, 15%, 18%, 20%, 25%, 30%, 40%, 50%, 60%, 75%, 80% or 90%), appropiate to the specific supercritical fluid involved. As a further specific example, the concentration of the precursor can be below about 40% when $CO_2$ is used as the supercritical fluid in the SCF-based deposition composition. The foregoing weight percentages are based on the weight of the SCF in the composition.

Further, the deposition compositions of the invention may selectively comprise, consist of, or consist essentially of, any of the SCF, precursor component(s) and optional additional components of the compositions disclosed herein.

Deposition using the SCF-based deposition compositions of the invention may be carried out in any suitable manner, as regards contacting of the deposition composition with the substrate. Chemical vapor deposition techniques may be employed, or other modes of application of the deposition composition to the substrate can be effected.

For example, in one approach, a polymeric or oligomeric precursor species is dissolved in a supercritical fluid to form the SCF-based deposition composition. This deposition composition in solution form then can be sprayed into a fine mist or otherwise aerosolized. When the mist or aerosol is transported onto the substrate surface, polymeric films are formed. This technique is suitable for forming low k films from polymeric, oligomeric, pre-polymeric, or monomeric precursor components, or combinations of same. In some applications, it is desirable to transport the fluid media as a fine mist or aerosol to the substrate surface in a carrier fluid, or alternatively the composition may be delivered to the substrate in neat fluid, mist or aerosol form.

As another variant technique within the broad scope of the present invention, one or more precursor component(s) can be dissolved in a supercritical fluid, with the solution then being subjected to rapid expansion. As a result of such rapid expansion, the precursor component(s) are vaporized into fine vapor particles or nano-sized aerosols (depending on the rapid expansion conditions), and such fine vapor particles or aerosol can be used in CVD-type deposition processes.

The aforementioned techniques are useful for deposition of metals for interconnect structures, as well as low k and high k dielectrics, and other materials and thin film compositions. Preferred supercritical fluids for such purpose include carbon dioxide, methane, ethane, methanol, dimethyl ketone and sulfur hexafluoride.

The precursor components for the materials to be deposited on the substrate may be of any suitable type. Illustrative precursor components include, without limitation, organometallic source reagent compounds and complexes, and Lewis base adducts thereof, as well as the semiconductor manufacturing precursor components described in U.S. Pat. No. 5,840,897 issued Nov. 24, 1998, U.S. Pat. No. 5,453,494 issued Jan. 18, 1994, U.S. Pat. No. 6,110,529 issued Aug. 29, 2000, U.S. Pat. No. 5,820,664 issued Mar. 31, 1995, and U.S. Pat. No. 5,225,561 issued Sep. 12, 1990, the disclosures of all of which are hereby incorporated herein by reference, in their respective entireties.

The invention contemplates application of SCF-assisted deposition to any of a wide variety of suitable techniques for depositing materials on substrates.

In one embodiment, SCF-assisted deposition is employed to enhance physical vapor deposition (PVD) processes. In contrast to conventional PVD techniques, which are conducted in an evacuated chamber, utilizing a charged gas and a sputter target for deposition of material on a substrate, e.g., semiconductor wafer, the PVD process can be modified in accordance with the present invention to utilize SCF-assisted deposition techniques. Instead of a low-pressure system, a supercritical fluid, e.g., carbon dioxide and/or argon, or other SCF, is employed.

In carrying out such modified PVD process, it may be desirable to provide an added Lewis base (e.g., PF3) or to conduct the deposition in the presence of media such as CO, to form corresponding metal complexes in the PVD process. Illustrative examples of metal complexes of such type include, without limitation, $Mo(CO)_6$, $W(CO)_6$, $Cr(CO)_6$, $W(PF_3)_6$, $Co_2(CO)_8$, and $Co_2(PF_3)_8$.

By use of an SCF ambient environment in such modified PVD operation, a reduced level of particle generation, improved control of deposition into very tight geometries, improved control of diffusion of the sputtered material, and application of gas phase reactions in the PVD process (for forming barriers, or capping layers) are achievable, relative to conventional PVD techniques.

In another embodiment of the invention, low k films are formed using alkyl silanes, siloxane precursors, and even organic-based non-silicon-containing low k precursors, such as the low k dielectric thermosetting resin sold by The Dow Chemical Company under the trademark SiLK. Silxoane precursors may be of any suitable type, as for example alkyl siloxanes and cyclosiloxanes, such as tetramethylcyclotetrasiloxane (TMCTS) and octamethyltetracyclosiloxane (OMCTS). Other low k film precursor materials can be utilized in the SCF-based deposition process of the present invention to form superior films on substrates, without issues of adverse polymerization effects.

The deposition compositions of the invention therefore include compositions wherein the precursor is a silicon source reagent, e.g., a siloxane in combination with an alkylsilane, e.g., trimethylsilane or tetramethylsilane. In another specific composition, the silicon source reagent comprises a siloxane, which is used in combination with a porogen, to form a porous low k film on the substrate.

The invention resolves a major deficiency of siloxane precursors that has limited the utility of such materials for deposition applications. Specifically, the presence of even trace amounts of impurities in such siloxane precursors poses a risk of cationic or anionic polymerization, particularly at high temperatures, such as would otherwise result in premature degradation in delivery lines to the deposition chamber. For example, TMCTS polymerizes in delivery lines at elevated temperatures, usually about 120° C., with potentially catastrophic consequences to the deposition process and associated equipment.

Such premature degradation problems are overcome by SCF-based precursor delivery and deposition in accordance with the present invention. Supercritical fluid solutions of low k precursors are readily delivered into the growth chamber at low temperature, e.g., as low as 31.1° C., due to the low viscosity of such solutions. Further, at the point that the pressure of the supercritical fluid solution is reduced, the solution undergoes rapid expansion in volume, to vaporize the precursor into a precursor vapor, with no ancillary heating requirement being required.

Thus, the SCF-based deposition techniques of the invention, in application to low k film precursors, reduce thermally-induced polymerization of precursors such as siloxanes. More generally, thermally unstable low k film precursors of variant types are advantageously delivered to the deposition substrate by SCF-based compositions. SCF species that are particularly useful for such purpose include carbon dioxide, methane, methanol, dimethyl ketone and sulfur hexafluoride.

In another aspect, SCF-based deposition compositions of the invention may be employed for precursor delivery to the substrate, to form barrier layers, e.g., of TiN, TaN, NbN, WN or their corresponding silicides, or interconnect and metallization structures, e.g., of copper, aluminum or other metals, metal alloys and species, on semiconductor substrates. The precursors for such purpose are dissolved in appropriate amounts in SCF media, and contacted with the heated substrate to effect deposition of the desired material.

For barrier layer formation, barrier layer precursor materials may be of any suitable type for forming the aforementioned nitrides and silicides. Illustrative precursor components include, without limitation, titanium (IV) tetrakis-dialkylamides such as tetrakis diethylamido titanium (TDEAT), tetrakis dimethylamino titanium (TDMAT), and pyrozolate titanium compounds and other titanium amido and imido compounds. Illustrative tantalum nitride (TaN) barrier precursor compounds include, without limitation, Ta (IV) pentakis(dialkylamido) compounds, such as pentakis ethylmethylamido tantalum (PEMAT), pentakis dimethylamido tantalum (PDMAT) and pentakis diethylamido tantalum (PDEAT), and their W, Nb corresponding compounds.

Useful interconnect material precursors include, without limitation, metal beta-diketonate precursors, such as (hfac) Cu (I) Lewis base adducts, as well as metal formates and metal acetates and their Lewis base adducts.

For barrier layer or interconnect deposition applications, the SCF-based deposition composition can usefully contain optional co-reactants such as ammonia ($NH_3$), hydrogen or other reducing co-reactants.

Barrier layer and metallization deposition applications can be carried out in any suitable manner, as regards the deposition process. For example, the SCF-based deposition composition can be delivered onto the substrate surface in a continuous manner, to effect continuous film growth on the substrate surface, with by-products of the deposition being carried away in the exhaust stream of supercritical fluid that is discharged from the deposition chamber. Alternatively, the SCF-based deposition composition may be transported to a vaporizer, whereby the deposition composition undergoes rapid expansion and vaporizes the precursor component(s) into precursor vapor. Such vaporization may be carried out at very low temperature, e.g., room temperature, with the resulting precursor vapor being directed onto the heated substrate surface to grow the desired film thereon.

Since precursor components are in many cases quite reactive, the selection of supercritical fluid is important to ensure chemical compatibility of the deposition composition. The supercritical fluids useful for the aforementioned barrier layer and metallization deposition include, without limitation, $CO_2$, $NH_3$, $CH_4$, $SF_6$, $N_2O$, CO, and the like.

In a particular aspect of the present invention, SCF-based deposition compositions are usefully employed for forming copper metallization on integrated circuitry substrates. In such application, the supercritical fluid facilitates a low surface tension, high-pressure technique for deposition of copper thin films in deep trench and high aspect ratio via structures.

Other applications of the invention include deposition of dielectric oxides.

As an important aspect of the present invention, deposition of metal thin films using SCF-assisted techniques in accordance with the instant invention, relaxes the requirements for volatile metal precursors that would otherwise be necessary. By relaxing the requirement of volatile metal precursors, the SCF-assisted deposition techniques of the present invention obviate the need for fluorine-functionalized precursors, which are currently being increasingly used in the semiconductor manufacturing industry to satisfy precursor volatility requirements. For SCF-assisted deposition, the precursor component(s) need only be soluble in the SCF medium in order to be transported to the deposition chamber and thermally decomposed onto the heated substrate.

In specific application to copper metallization, the invention permits the use of low-cost, non-volatile copper (I) and copper (II) precursors for deposition of thin film copper without the need for fluorine-containing precursors. This flexibility in turn eliminates fluorine contamination on barrier surfaces and reduces electrical contact resistances of inter-metallic layers, such as M1 to M2 copper layers, and improves the adhesion of the copper film to nitride barriers.

In accordance with the invention, copper may be deposited on a substrate from SCF solution, utilizing a wide variety of non-volatile or low volatility copper precursors. Illustrative copper precursors include, without limitation, copper (II) β-diketonates, copper (II) carboxylates, copper (I) cyclopentadienes, copper (I) phenyls, copper (I) amides, and Lewis base adducts of the aforementioned copper (I) and copper (II) species. A preferred supercritical fluid for such copper deposition applications is carbon dioxide.

Since supercritical fluids exhibit liquid-like densities and gas-like viscosities, having solvating properties similar to those of organic solvents (e.g., pentane, hexane, and toluene), supercritical fluids can dissolve many copper compounds that are soluble in organic solvents. Supercritical fluid solutions containing copper precursor(s) are easily delivered to the film growth chamber for contacting with the substrate to deposit copper films thereon. Since surface tension is greatly reduced by the SCF in the deposition composition, the copper precursor is effectively delivered into trenches and via openings with very high aspect ratios, to achieve superior conformal coating therein.

Copper precursor components usefully employed in the broad practice of the present invention for copper deposition include, without limitation, the following:

Cu (II) (β-diketonato)$_2$ species, such as Cu (II) (acac)$_2$, Cu (II) (thd)$_2$ and Cu (tod)$_2$ as well as other non-fluorinated β-diketonate copper compounds and complexes;

Cu (carboxylate)$_2$ species, such as Cu (formate)$_2$ and Cu (acetate)$_2$ and other long-chain (e.g., $C_8$-$C_{40}$ and more preferably from $C_8$-$C_{30}$) carboxylates. Cu (fornate)$_2$ is a preferred copper source reagent because the formate ligand is able to act as a reducing agent, leading to ultra-pure copper films upon thermal decomposition. Even higher solubility of copper formate in the SCF medium is obtainable by polyamine complexation of Cu (formate)$_2$. Copper (II) carboxylates are a preferred copper precursor species, since such compounds are relatively easy to synthesize, utilizing low-cost starting materials. Such compounds have not heretofore been contemplated for use in copper deposition applications, due to their poor volatility and poor transport characteristics, but are readily used for such purpose by formulation in SCF media in accordance with the present invention. As a result, the cost of ownership (COO) of copper deposition process systems is decreased by the use of such low cost copper precursors.

(Cyclopentadienyl) CuL complexes (wherein L is a suitable ligand species), for example CpCu (I) PMe$_3$. Such precursors are fluorine-free and are soluble in pentane and other organic solvents, and may be advantageously utilized in the practice of the present invention.

Copper (I) phenyl tetramers, such as copper (I) pentaflurophenyl or copper (I) t-butyl phenyl tetramer.

Copper (I) amides, such as bis(trimethylsilylamide) tetramer.

As alluded to above in respect of copper carboxylate precursors such as copper formate, the present invention contemplates SCF-based deposition compositions containing at least one copper precursor, wherein the copper precursor contains a ligand that serves as a reducing agent for production of ultrahigh-purity copper films on the substrate.

As a further alternative, the SCF-based deposition composition can comprise an SCF that is itself a reducing agent, or as a still further alternative, the SCF-based deposition composition can additionally optionally contain other reducing agent(s) for ensuring high purity copper deposition on the substrate. Suitable reducing agents for such purpose may be readily determined without undue experimentation, within the skill of the art. Illustrative reducing species include, without limitation, hydrogen and isopropyl alcohol.

In the SCF-based deposition compositions of the invention, various enhancing agents and other beneficial components may be incorporated in the composition.

For example, in SCF-based copper (II) precursor compositions, isopropyl alcohol may be added in a concentration of from about 0.1% to about 99.9% by weight, based on the weight of the SCF component(s). The use of IPA as an enhancing agent is highly advantageous when the SCF component is carbon dioxide, since isopropyl alcohol may increase copper precursor solubility in the supercritical carbon dioxide, while simultaneously functioning as a reducing agent to reduce Cu (II) to Cu (0). The isopropyl alcohol may be oxidized to acetone during the deposition process, and is readily recovered from the SCF effluent discharged from the deposition chamber, for recovery and reuse thereof, or alternatively for other disposition.

For copper deposition, the SCF can be of any suitable type, including, without limitation, $CO_2$, $CH_4$, $C_2H_6$, $CH_3OH$, $C_2H_5OH$, $(CH_3)_2CHOH$, $CH_3COCH_3$ and $SF_6$.

The SCF-based copper precursor compositions of the invention afford a highly effective approach to deposition of copper films on substrates. Such compositions may be employed in semiconductor manufacturing operations as one of sequential deposition steps carried out in a cluster tool for wafer processing.

It will be appreciated that the compositions and methods of the invention may be practiced in a widely variant manner, consistent with the broad disclosure herein. Accordingly, while the invention has been described herein with reference to specific features, aspects, and embodiments, it will be recognized that the invention is not thus limited, but is susceptible of implementation in other variations, modifications and embodiments. Accordingly, the invention is intended to be broadly onstrued to encompass all such other variations, modifications and embodiments, as being within the scope of the invention hereinafter claimed.

What is claimed is:

1. A method of forming a material on a substrate, comprising depositing the material on the substrate from a deposition composition comprising (a) a precursor of said material, (b) at least one surfactant, and (c) a supercritical fluid.

2. The method of claim 1, wherein the supercritical fluid comprises a fluid selected from the group consisting of: carbon dioxide, oxygen, argon, krypton, xenon, ammonia, methane, ethane, methanol, ethanol, isopropanol, dimethyl ketone, sulfur hexafluoride, carbon monoxide, dinitrogen oxide, forming gas, hydrogen, and mixtures thereof.

3. The method of claim 1, wherein the supercritical fluid comprises carbon dioxide.

4. The, method of claim 1, wherein said composition furthercomprises a co-solvent.

5. The method of claim 4, wherein said co-solvent comprises a solvent selected from the group consisting of: methanol, ethanol, isopropyl alcohol, N-methylpyrrolidone, N-octylpyrrolidone, N-phenylpyrrolidone, dimethylsulfoxide, sulfolane, catechol, ethyl lactate, acetone, butyl carbitol, monoethanolamine, butyrol lactone, diglycol amine, γ-butyrolactone, butylene carbonate, ethylene carbonate, and propylene carbonate.

6. The method of claim 1, wherein the deposition composition consists essentially of said supercritical fluid, said precursor, and said surfactant.

7. The method of claim 1, wherein the deposition composition consists of said supercritical fluid, said precursor, and said surfactant.

8. The method of claim 1, wherein said material comprises a semiconductor manufacturing material.

9. The method of claim 8, wherein said semiconductor manufacturing material comprises a material selected from the group consisting of semiconductor materials, dielectric materials, barrier layer materials, interconnect materials and metallization materials.

10. The method of claim 1, wherein said material comprises a semiconductor material.

11. The method of claim 1, wherein said material comprises a dielectric material.

12. The method of claim 1, wherein said material comprises a low k material.

13. The method of claim 1, wherein said material comprises a high k material.

14. The method of claim 1, wherein said material comprises a barrier layer material.

15. The method of claim 14 wherein said barrier layer material comprises a material selected from the group consisting of TiN, TaN, NbN, WN, and corresponding silicides thereof.

16. The method of claim 1, wherein said material comprises an interconnect material.

17. The method of claim 16, wherein said interconnect material comprises a material selected from the group consisting of metals and metal alloys.

18. The method of claim 17, wherein said material comprises a metal selected from the group consisting of copper and aluminum.

19. The method of claim 1, wherein said material comprises a metallization material.

20. The method of claim 19, wherein said metallization material comprises a material selected from the group consisting of metals and metal alloys.

21. The method of claim 20, wherein said material comprises a metal selected from the group consisting of copper and aluminum.

22. The method of claim 1, wherein the deposition composition further comprises at least one component selected from the group consisting of co-solvents, co-reactants, diluents, and depostion-enhancing agents.

23. The method of claim 22, wherein said at least one component comprises at least one co-solvent or co-reactant, wherein said at least one co-solvent or co-reactant is selected from the group consisting of alcohols, N-alkyl pyrrolidones, N-aryl pyrrolidones, dimethylsulfoxide, sulfolane, catechol, ethyl lactate, acetone, butyl carbitol, monoethanolamine, butyrol lactone, diglycol amine, γ-butyrolactone, butylene carbonate, ethylene carbonate, and propylene carbonate.

24. The method of claim 1, wherein said at least one surfactant comprises a species selected from the group consisting of an anionic surfactant, a neutral surfactant, a cationic surfactant, and a zwitterionic surfactant.

25. The method of claim 1, wherein at least one surfactant comprises a surfactant selected from the group consisting of acetylenic alcohols, acetylenic diols, long alkyl chain secondary and tertiary amines, and fluorinated derivatives of the foregoing.

26. The method of claim 25, wherein said at least one surfactant comprises a surfactant selected from the group consisting of: 3,4-dimethyl-1-hexyn-3-ol; 2,4,7,9-tetramethyl-5-decyn-4,7-diol; and fluorinated surfactants.

27. The method of claim 1, wherein the precursor has a concentration not exceeding about 40% by weight, based on the weight of the supercritical fluid in the composition.

28. The method of claim 1, wherein the precursor comprises a polymeric precursor.

29. The method of claim 1, wherein the precursor comprises an oligomeric precursor.

30. The method of claim 1, wherein the precursor comprises a thin film precursor.

31. The method of claim 1, wherein the precursor comprises a precursor selected from the group consisting of metal precursors and dielectric material precursors.

32. The method of claim 31, wherein the supercritical fluid comprises a supercritical fluid selected from the group consisting of carbon dioxide, methane, ethane, methanol, dimethyl ketone and sulfur hexafluoride.

33. The method of claim 1, wherein the precursor comprises a precursor selected from the group consisting of organometallic compounds and complexes, and Lewis base adducts thereof.

34. The method of claim 1, wherein the deposition composition further comprises at least one Lewis base.

35. The method of claim 1, wherein the precursor comprises a precursor selected from the group consisting of alkyl silanes, siloxanes and organic-based non-silicon-containing low k dielectric precursors.

36. The method of claim 1, wherein the precursor comprises a precursor selected from the group consisting of siloxanes.

37. The method of claim 36, wherein the precursor comprises an alkyl siloxane.

38. The method of claim 36, wherein the precursor comprises a cyclosiloxane.

39. The method of claim 36, wherein the precursor comprises a cyclosiloxane selected from the group consisting of tetramethylcyclotetrasiloxane (TMCTS) and octamethyltetracyclosiloxane (OMCTS).

40. The method of claim 1, wherein the precursor comprises a thermally unstable low k film precursor.

41. The method of claim 40, wherein the supereritical fluid comprises a supereritical fluid selected from the group consisting of carbon dioxide, methane, methanol, dimethyl ketone and sulfur hexafluoride.

42. The method of claim 1, wherein the precursor is insufficiently volatile for chemical vapor deposition in absence of the supercritical fluid.

43. The method of claim 1, wherein the precursor comprises a barrier layer precursor selected from the group consisting of titanium (liv) tetrakis-dialkylamides, titanium pyrozolates, titanium amido compounds, titanium imido compounds, Ta (IV) pentakis(dialkylamido) compounds, and corresponding W and Nb analogs of such titanium and tantalum compounds.

44. The method of claim 1, wherein the precursor comprises a barrier layer precursor selected from the group consisting of tetrakis diethylamido titanium (TDEAT), tetrakis dimethylamino titanium (TDMAT), pentakis ethylmethylamido tantalum (PEMAT), pentakis dimethylamido tantalum (PDMAT), pentakis diethylamido tantalum (PDEAT), and corresponding W and Nb analogs of such titanium and tantalum compounds.

45. The method of claim 1, wherein the precursor comprises a metal precursor selected from the group consisting of metal beta-diketonates, metal formates metal acetates, and Lewis base adducts of the foregoing.

46. The method of claim 45, wherein the metal precursor comprises a metal selected from the group consisting of copper, aluminum, titanium, tantalum, niobium, tungsten, molybdenum, chromium, and cobalt.

47. The method of claim 1, wherein the precursor comprises a copper precursor.

48. The method of claim 47, wherein the copper precursor is selected from the group consisting of: copper (II) β-diketonates, copper (II) carboxylates, copper (I) cyclopentadienes, copper (I) phenyls, copper (I) amides, and Lewis base adducts of the aforementioned copper (I) and copper (II) species.

49. The method of claim 47, wherein the copper precursor is selected from the group consisting of: β-diketonate copper compounds and complexes; copper (carboxylate)$_2$ compounds and complexes; cyclopentadienyl copper-ligand complexes; copper aryl tetramers; and copper amides.

50. The method of claim 47, wherein the copper precursor is selected from the group consisting of: copper (β-diketonato)$_2$ compounds and complexes; copper (carboxylate)$_2$ compounds and complexes, wherein each carboxylate moiety is independently selected from the group consisting of $C_1$-$C_{40}$ carboxylate moieties; cyclopentadienyl copper-ligand complexes; copper phenyl tetramers; and copper amides.

51. The method of claim 47, wherein the copper precursor is selected from the group consisting of: Cu (II) (acac)$_2$, Cu (II) (thd)$_2$, Cu (tod)$_2$, Cu (formate)$_2$, Cu (acetate)$_2$, CpCu(I) PMe$_3$, Cu (I) pentaflurophenyl, Cu (I) t-butyl phenyl tetramer, and Cu(I) bis(trimethylsilylamide) tetramer.

52. The method of claim 1, wherein the deposition composition further comprises an additive selected from the group consisting of hydrogen and ammonia.

53. The method of claim 1, wherein the precursor comprises a barrier layer or metallization precursor and the supercritical fluid comprises a supercritical fluid species selected from the group consisting of $CO_2$, $NH_3$, $CH_4$, $SF_6$, $N_2O$, and CO.

54. The method of claim 1, wherein the deposition composition is devoid of fluorine-containing components.

55. The method of claim 1, wherein the precursor comprises a copper (II) carboxylate compound or complex.

56. The method of claim 55, wherein the precursor comprises copper formate.

57. The method of claim 55, wherein the precursor comprises a copper formate polyamine complex.

58. The method of claim 1, wherein the precursor comprises a copper precursor, and the deposition composition further comprises a reducing agent.

59. The method of claim 58, wherein the reducing agent comprises at least one reducing agent selected from the group consisting of hydrogen, formaldehyde and alcohols.

60. The method of claim 58, wherein the reducing agent comprises hydrogen.

61. The method of claim 58, wherein the reducing agent comprises formaldehyde.

62. The method of claim 58, wherein the reducing agent comprises isopropanol.

63. The method of claim 62, wherein isopropanol is present in said composition at a concentration of from about 0.1% to about 99.9% by weight, based on the weight of the supercritical fluid.

64. The method of claim 1, wherein the precursor comprises a copper precursor selected from the group consisting of copper carboxylates, copper β-diketonates, and complexes and adducts thereof, and the supercritical fluid is selected from the group consisting of $CO_2$, $CH_4$, $C_2H_6$, $CH_3OH$, $C_2H_5OH$, $(CH_3)_2CHOH$, $CH_3COCH_3$ and $SF_6$.

65. The method of claim 1, wherein the precursor comprises a silicon precursor.

66. The method of claim 65, wherein the silicon precursor comprises a siloxane and an alkylsilane.

67. The method of claim 66, wherein the alkylsilane comprises trimethylsilane.

68. The method of claim 66, wherein the alkylsilane comprises tetramethylsilane.

69. The method of claim 1, wherein the silicon precursor comprises a siloxane, and the composition further comprises a porogen effective in combination with the siloxane to form a porous low k film on the substrate.

70. The method of claim 1, wherein the substrate comprises a semiconductor wafer.

71. The method of claim 1, wherein the substrate comprises a heated substrate and said depositing comprises contacting the deposition composition with the heated substrate for forming said material as a layer on the heated substrate.

72. The method of claim 71, wherein the precursor comprises a source reagent compound or complex and said material comprises a metal or dielectric film.

73. The method of claim 71, wherein said depositing comprises continuously delivering the deposition composition to the heated substrate, to deposit the material thereon from the precursor.

74. The method of claim 73, wherein said depositing is carried out in a deposition chamber and generates deposition by-products, and said method further comprises continuously discharging the deposition by-products from the deposition chamber during said depositing.

75. The method of claim 71, wherein said depositing is carried out in a batch mode, wherein the deposition composition is contacted with the substrate, and process condition(s) of the deposition composition are altered to effect said depositing of material on the substrate from the precursor in the deposition composition.

76. The method of claim 75, wherein the process condition(s) that are altered comprise at least one of temperature and pressure.

77. The method of claim 75, wherein the process condition(s) that are altered comprise temperature.

78. The method of claim 75, wherein the process condition(s) that are altered comprise pressure.

79. The method of claim 75, wherein the process condition(s) that are altered comprise temperature and pressure.

80. The method of claim 1, wherein said depositing comprises chemical vapor deposition.

81. The method of claim 1, wherein said precursor comprises a polymeric or oligomeric precursor, said method further comprises dissolving the polymeric or oligomeric precursor species in the supercritical fluid to form the deposition composition, rendering the deposition composition into a finely divided fluid form, and transporting the finely divided fluid form deposition composition to the substrate for said depositing of material thereon.

82. The method of claim 81, wherein the material comprises a low k film.

83. The method of claim 1, wherein said deposition composition is rapidly expanded to form vapor particles comprising the precursor, and said vapor particles are contacted with the substrate in said depositing.

84. The method of claim 1, and said precursor comprises a silicon source reagent.

85. The method of claim 84, wherein said silicon source reagent comprises a reagent selected from the group consisting of alkyl silanes and siloxanes.

86. The method of claim 85, wherein the supercritical fluid comprises a fluid selected from the group consisting of carbon dioxide, methane, methanol, dimethyl ketone and sulfur hexafluoride.

87. A thin film deposited using the method of claim 1.

88. A method of forming a metal material on a substrate, comprising depositing the metal material on the substrate from a deposition composition comprising a precursor of said metal material, and a supercritical fluid, wherein said precursor comprises a metal selected from the group consisting of chromium and cobalt.

89. The method of claim 88, wherein the precursor comprises a metal precursor selected from the group consisting of metal beta-diketonates, metal formates, metal acetates, and Lewis base adducts of the foregoing.

90. The method of claim 88, wherein the deposition composition further comprises at least one component selected from the group consisting of co-solvents, co-reactants, surfactants, diluents, and deposition-enhancing agents.

91. The method of claim 88, wherein the supercritical fluid comprises a fluid selected from the group consisting of: carbon dioxide, oxygen, argon, krypton, xenon, ammonia, methane, ethane, methanol, ethanol, isopropanol, dimethyl ketone, sulfur hexafluoride, carbon monoxide, dinitrogen oxide, forming gas, hydrogen, and mixtures thereof.

* * * * *

UNITED STATES PATENT AND TRADEMARK OFFICE
CERTIFICATE OF CORRECTION

PATENT NO. : 7,294,528 B2
APPLICATION NO. : 11/078211
DATED : November 13, 2007
INVENTOR(S) : Chongying Xu et al.

It is certified that error appears in the above-identified patent and that said Letters Patent is hereby corrected as shown below:

Column 3, line 47, please delete "sulfolan" and insert in place thereof -- sulfolane --
Column 4, line 2, please delete "appropiate" and insert in place thereof -- appropriate --
Column 7, line 45, please delete "fornate" and insert in place thereof -- formate --
Column 8, line 51, please delete "onstrued" and insert in place thereof -- construed --
Column 9, line 2, please delete "furthercomprises" and insert in place thereof -- further comprises --
Column 9, line 57, please delete "depostion" and insert in place thereof -- deposition --
Column 10, line 51, please delete "supereritical" and insert in place thereof -- supercritical --
Column 10, line 52, please delete "supereritical" and insert in place thereof -- supercritical --
Column 10, line 60, please delete "(liv)" and insert in place thereof -- (IV) --

Signed and Sealed this

Twelfth Day of August, 2008

JON W. DUDAS
*Director of the United States Patent and Trademark Office*